United States Patent [19]
Lee et al.

[11] Patent Number: 5,578,951
[45] Date of Patent: Nov. 26, 1996

[54] CMOS CIRCUIT FOR IMPROVED POWER-ON RESET TIMING

[75] Inventors: Hee-choon Lee, Seoul; Je-whan Yoo, Kyungki-do, both of Rep. of Korea

[73] Assignee: Samsung Electronics Co., Ltd., Suwon, Rep. of Korea

[21] Appl. No.: 352,250

[22] Filed: Dec. 8, 1994

[30]      Foreign Application Priority Data

Dec. 10, 1993 [KR] Rep. of Korea ............... 93-27140

[51] Int. Cl.⁶ ................................................ H03L 7/00
[52] U.S. Cl. ........................................ 327/143; 327/198
[58] Field of Search ................................ 327/142, 143, 327/530, 198, 374, 377, 427, 437

[56]          References Cited

U.S. PATENT DOCUMENTS

| | | | |
|---|---|---|---|
| 4,970,408 | 11/1990 | Hanke et al. | 327/143 |
| 4,983,857 | 1/1991 | Steele | 327/143 |
| 5,278,458 | 1/1994 | Holland et al. | 327/142 |
| 5,323,067 | 6/1994 | Shay | 327/142 |

*Primary Examiner*—Timothy P. Callahan
*Assistant Examiner*—Kenneth B. Wells

[57]          ABSTRACT

A power-on reset circuit includes a discharger for applying a negative voltage to the gate of a transistor and quickly discharging a first intermediate signal during a power-off state to thereby generate a stable power-on reset signal even in fast switching of a power supply voltage, and a delay and buffer for maintaining the power-on reset signal at a first constant voltage for a predetermined time.

11 Claims, 4 Drawing Sheets

5,578,951

CMOS CIRCUIT FOR IMPROVED POWER-ON RESET TIMING

BACKGROUND OF THE INVENTION

The present invention relates to a circuit for generating a power-on reset signal, and more particularly, to a power-on reset circuit for use in a CMOS integrated circuit.

Generally speaking, a power-on reset circuit provides a reset signal for initializing flip-flops, latches, counters, registers and other such internal components of an integrated circuit, when power is applied thereto. The reset signal maintains a first constant voltage for a sufficient time to allow stabilization of the respective components of the circuit, and after a predetermined time, becomes a second constant voltage (i.e., the operating state voltage which is generally the inversion of the first constant voltage) for as long as the power is applied to the circuit.

Such power-on reset circuits are designed in consideration of steady-state power dissipation, chip layout, production costs and the stability of the reset signal. In designing a power-on reset circuit, the steady-state power dissipation should be minimized. Also, to economize the layout of the chip, the use of passive elements (e.g., capacitors and resistors) which occupy a relatively large area, and depletion-mode transistors which add a manufacturing step, should be avoided.

In order to supply a stable reset signal, the reset signal must be delayed to maintain the first constant voltage for a sufficient period of time. In addition, a discharge circuit is used to eliminate distortion of the reset signal due to the false operation of the reset circuit, which might be caused in a fast switching (on/off) of series power supply voltages.

Here, the power-on reset circuit generally uses a resistor or depletion transistor to stably discharge at internal nodes of the circuit. However, if the discharge path of the circuit is formed with a resistor, the resistor value must be in the range of several megaohms, and such large resistance values occupy a large area in the layout of the chip. On the other hand, if a depletion transistor is used, an additional manufacturing step is required in fabricating the chip.

Alternatively, when the discharge path of the above power-on reset circuit is simply formed of a diode, the voltage cannot be fully discharged at the moment when power is turned off, but is delayed for several milliseconds due to the junction leakage current of the diode. This produces a false operation condition in the reset circuit, which occurs when the power supply voltages may for instance be quickly switched on and off.

A known circuit which meets many of the above criteria is described in U.S. Pat. No. 4,746,822 entitled "CMOS Power-on Reset Circuit," issued to Jone Mahoney, et al. on May 24, 1988.

FIG. 1 illustrates a conventional power-on reset circuit for generating a power-on reset signal by using a capacitor and parasitic diode. In the drawing, the circuit is composed of a delay 1 in which a PMOS transistor P1 and NMOS transistor N1 are serially coupled and a capacitor C1 is connected so that the power-on reset signal is delayed when initial power is supplied, a discharger 2 having a parasitic diode D1 as the discharge path, and an initialization buffer 5 for generating the power-on reset (POR) signal. The initialization buffer 5 includes an input inverter 3 and an initializing circuit 4. The input inverter 3 includes a PMOS transistor P2 and an NMOS transistor N2 connected in series. The initializing circuit 4 includes a PMOS transistor P3 and an NMOS transistor N3 connected in series, and a capacitor C2 connected between the gate of transistors P3 and N3 and the power supply voltage $V_{DD}$.

In the operation of the conventional circuit of FIG. 1, at the initial state when a power supply voltage $V_{DD}$ is applied, the voltage $V_{DD}$ is at 0 V, making the voltage at node A also zero potential (low level), so that transistor N2 is in the "off" state. As power supply voltage $V_{DD}$ increases, the voltage at node B increases. When the power supply voltage reaches the threshold voltage of transistor N3, transistor N3 is turned on and the reset signal at node C has a low level (0 V). This reset signal is used to initialize the other parts of an integrated circuit.

If the power supply voltage is greater than the sum of the threshold voltages of transistor N1 and transistor P1 of the delay 1, transistors N1 and P1 are both turned on. At this time, with transistors N1 and P1 turned on, an RC time constant created by capacitor C1 and "on" resistance (voltage drop) of transistor P1 causes a sufficient time to pass before node A and the reset signal at node C become a high level to thereby normally operate the other circuits. When the power supply voltage is turned off, the voltage at node A is discharged through parasitic diode D1 and transistor N4 of the discharger.

In the conventional power-on reset circuit, the voltage at node A is discharged to ground potential by the junction leakage current of parasitic diode D2 in accordance with the threshold voltage of transistor N4. However, if the on/off switching time of the power supply voltage is fast (say, tens of microseconds), the junction leakage current of parasitic diode D2 cannot sufficiently guarantee that the voltage at node A will be fully discharged to ground potential. As a result, the desired reset signal cannot be obtained and thus the power-on reset circuit performs a false operation.

FIG. 2 illustrates the waveforms of the reset signal of the conventional power-on reset circuit in fast switching of the power supply voltage. At the initial power-on state, the reset circuit operates normally to output a desired reset signal. However, thereafter, the discharge path cannot perform normally due to the insecure discharge mechanism of parasitic diode D2 of the reset circuit, so that the reset signal is swung with the same pattern as that of the power supply voltage.

In the conventional power-on reset circuit, a resistor is sometimes used to discharge the voltage at node A. In this case, in order to reduce the stand-by current, a resistor of several megaohms is required, which occupies an excessive amount of layout area of the chip and decreases the efficiency of the layout accordingly.

SUMMARY OF THE INVENTION

Therefore, in order to overcome such problems, it is an object of the present invention to provide a power-on reset circuit which can be fabricated with ordinary CMOS IC technology, instead of using a passive element or depletion transistor, and which does not cause false operation in fast on/off switching of a power supply voltage, To accomplish the object of the present invention, there is provided a power-on reset circuit for a semiconductor integrated circuit, comprising: discharging means for fully discharging a first intermediate signal when a first power supply voltage is off, to thereby generate a first constant voltage of a power-on reset signal when the first power supply voltage is on; delaying means for receiving the first intermediate signal, maintaining the power-on reset signal at the constant voltage for a predetermined time when the first power supply voltage is raised above a first predetermined voltage, and generating a second intermediate signal; first inverting means for receiving and inverting the second intermediate signal; and buffering means for receiving the output of the first inverting means, allowing the power-on reset signal to maintain the first constant voltage for a predetermined time, and outputting the signal as a second constant voltage when the first power supply voltage is raised above a second predetermined voltage.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 3:
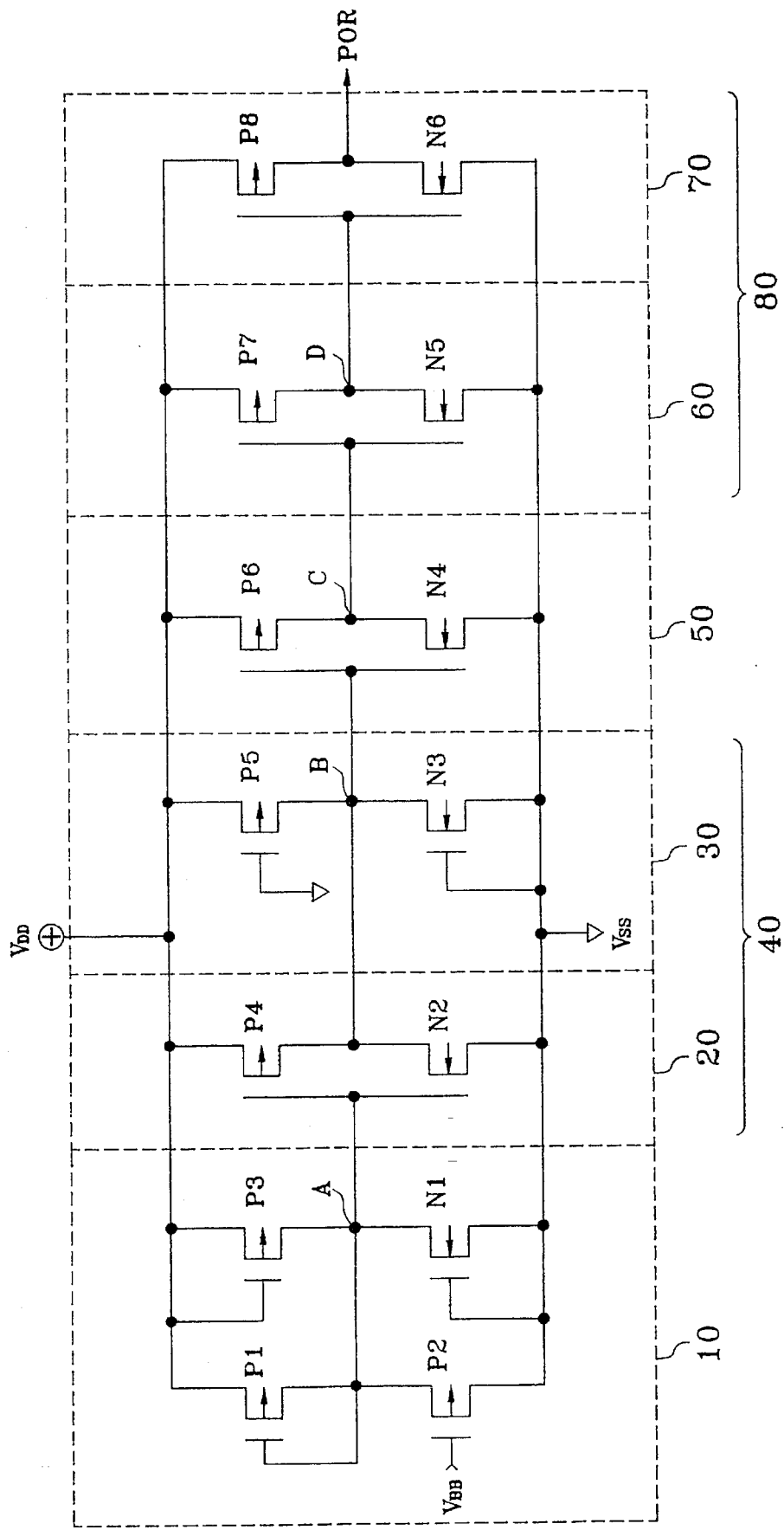
FIG. 3 is a circuit diagram of a power-on reset circuit of the present invention.

Referring to FIG. 3, a power-on reset circuit for generating a reset signal stable even in fast on/off switching of a power supply voltage comprises a discharger 10, a first inverter 50, a buffer 80 having a second inverter 60 and a third inverter 70, and a delay 40 having a fourth inverter 20.

Discharger 10 is comprised of three P-type transistors P1, P2, and P3 and one N-type transistor N1. The source of transistor P1 and the source and gate of transistor P3 are coupled to a power supply voltage $V_{DD}$. The drain of transistor P2 and the source and gate of transistor N1 are tied to a ground potential $V_{SS}$. Node A, the output of the discharger, is commonly connected to the gate and drain of transistor P1, the source of transistor P2, the drain of transistor P3, the drain of transistor N1 and the input of first inverter 20. The gate of transistor P2 is coupled to a first applied voltage $V_{BB}$ which is negative with respect to ground potential $V_{SS}$.

Fourth inverter 20 is composed of a P-type transistor P4 and N-type transistor N2. The source of transistor P4 is connected to power supply voltage $V_{DD}$, with the source of transistor N2 being tied to ground potential $V_{SS}$. The gates of transistors P4 and N2 are connected to node A which is the output of the discharger. The drains of transistors P4 and N2 are connected to node B which is commonly connected to the input of first inverter 50.

Initializer 30 has P-type transistor P5 and N-type transistor N3. The source of transistor P5 is connected to power supply voltage $V_{DD}$. The gate of transistor P5 and the gate and source of transistor N3 are coupled to ground potential $V_{SS}$. The drains of transistors P5 and N3 each are connected to node B.

First inverter 50 is made up of P-type transistor P6 and N-type transistor N4. The source of transistor P6 is coupled to power supply voltage $V_{DD}$ whereas the source of transistor N4 is coupled to ground potential $V_{SS}$. The gates of transistors P6 and N4 are both tied to node B, with their drains each being connected to node C which is the input of second inverter 60.

Second inverter 60 is made up of P-type transistor P7 and N-type transistor N5. The source of transistor P7 is coupled to power supply voltage $V_{DD}$ whereas the source of transistor N5 is coupled to ground potential $V_{SS}$. The gates of transistors P7 and N5 are both tied to node C, with their drains each being connected to node D which is the input of fourth inverter 70.

Third inverter 70 comprises P-type transistor P8 and N-type transistor N6. The source of transistor P8 is coupled to power supply voltage $V_{DD}$ whereas the source of transistor N6 is coupled to ground potential $V_{SS}$. The gates of transistors P8 and N6 are both tied to node D, with their drains each being connected to output POR.

The operation of the power-on reset circuit of the present invention will be described below based upon the configuration of FIG. 3.

First, for the initial conditions, with $V_{DD}$ equal to ground potential, the first intermediate signal at node A, the second intermediate signal at node B, and the power-on reset signal at output POR are all 0 V. Here, all of the transistors are off.

Then, when power supply voltage $V_{DD}$ rises above the P-type transistor threshold voltage $V_{TP}$ but is still below the sum of the P-type and N-type transistor threshold voltages $V_{TP}+V_{TN}$, transistors P1 and P5 are turned on, so that the first intermediate signal at node A measures $V_{DD}-V_{TP}$, transistor N2 of fourth inverter 20 is turned off and the second intermediate signal at node B becomes power supply voltage $V_{DD}$ by the turning on of pull-up transistor P5 of the delay 40. Since node B is connected to the gate of first inverter 50, transistor N4 of the second inverter is turned on so that node C has a low level. With a low level at node C which is the input of buffer 80, output POR (the output signal of the buffer), has a low level to thereby generate a stable power-on reset signal.

Thereafter, when the power supply voltage is raised above $V_{TP}+V_{TN}$, the voltage of the first intermediate signal at node A is $V_{DD}-V_{TP}$ and above the threshold voltage of transistor N2 so that transistor N2 is turned on. In addition, delay 40 controls the voltage of the second intermediate signal at node B and the level at output POR, by using the "on" resistance ratio of transistors P5 and N2, so that POR has a high level at the intended time. This allows output POR to have a low level for a sufficient time so that other circuits (not shown) in the chip are initialized for normal operation. Here, the dimensions of the gates of the transistors forming first inverter 50 and buffer 80 can be adjusted to further delay the signal at output POR.

When the power supply voltage is turned off, the respective internal components of the power-on reset circuit return to their initial state. Particularly, voltage $V_{DD}-V_{TP}$ at node A is discharged via transistors P2, P3 and N1 by discharger 10. Here, the voltage at node A is discharged to the threshold voltage $V_{TP}$ of transistor P3 via transistor P3, and thereafter to ground potential $V_{SS}$ via transistor P2. First applied voltage $V_{BB}$ being negative with respect to ground potential $V_{SS}$ is applied to the gate of transistor P2 so that transistor P2 is always on. Here, the length of the transistors may be increased to reduce stand-by current.

In the case of a memory circuit, the bulk voltage (substrate voltage) can be used for the first applied voltage $V_{BB}$ applied to the gate of transistor P2. This bulk voltage is about −1.5 V and maintains that potential for several milliseconds by a large parasitic capacitance produced between the bulk and well during the power-off state, so that the voltage at node A is discharged via transistor P2.

Figure 1:
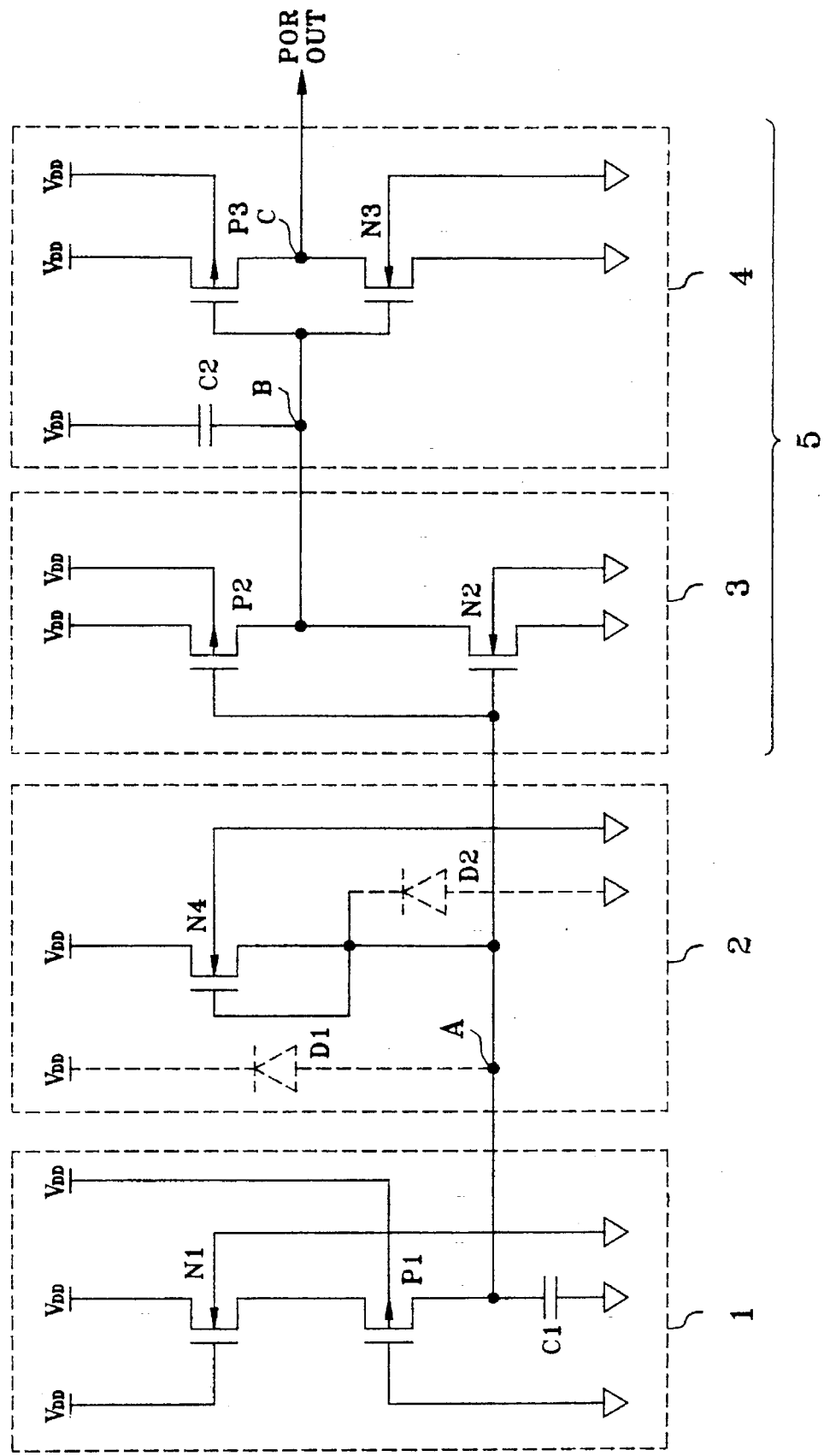
FIG. 1 is a circuit diagram of a conventional power-on reset circuit for generating a power-on reset signal, using a capacitor.
Figure 2:
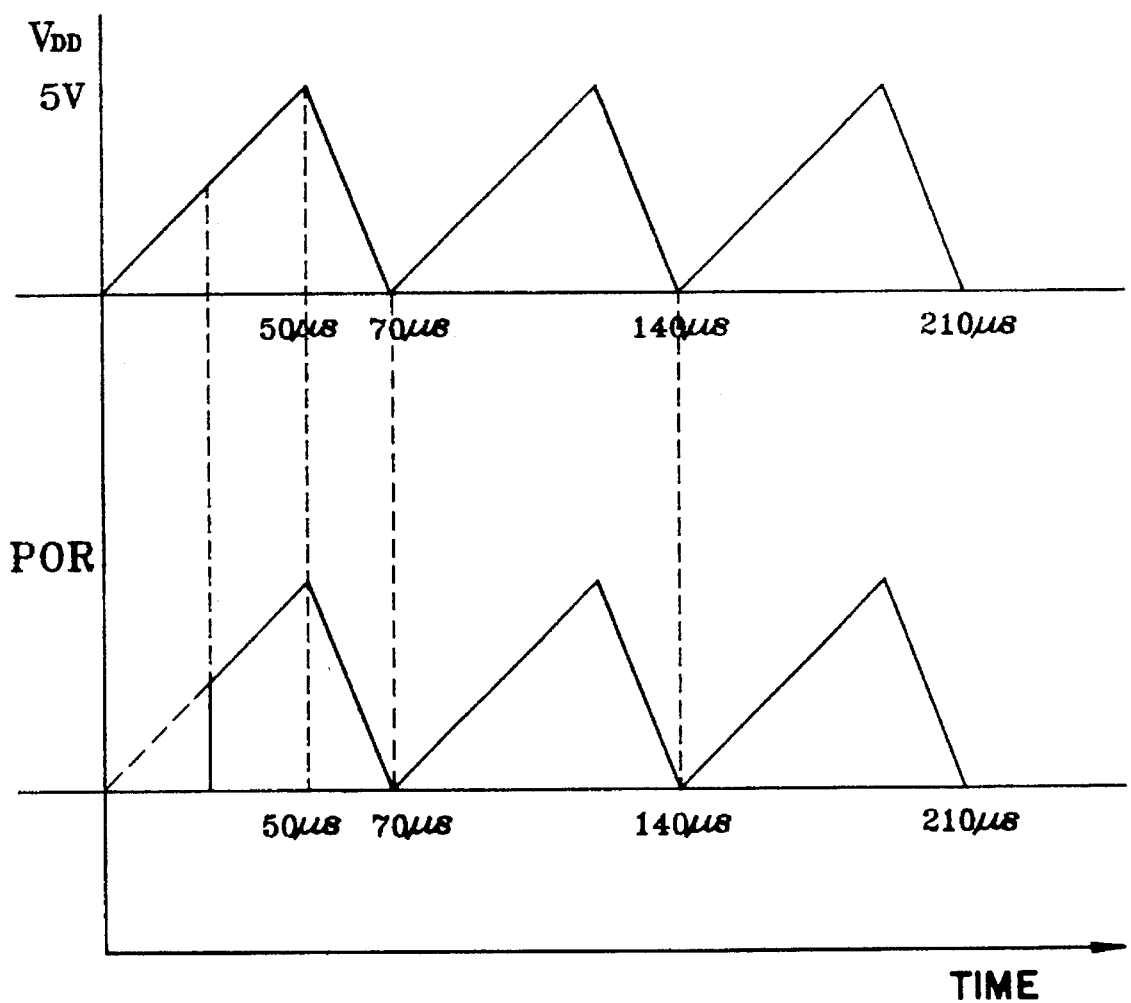
FIG. 2 is a waveform diagram of the conventional power-on reset signal, for the case when the power supply voltage is quickly switched on and off.

If there is no such transistor P2 for discharging to ground potential as described above, the voltage at node A becomes fully discharged only after a time period on the order of hundreds of milliseconds, by the junction leakage current of transistor N1 or the parasitic diode D2 of FIG. 1. If the switching time of voltage is fast, the discharging time of parasitic diode D2 for discharging the voltage at node A is insufficient so that the discharging is incomplete (does not reach ground potential $V_{SS}$). In addition, since the threshold voltage $V_{TP}$ of transistor P3 is present when the voltage is initially turned on, transistor N2 is on so that output signal (POR) has the same waveform as that of power supply voltage $V_{DD}$. As a result, the power-on reset signal for initializing other circuits cannot be properly generated, as in the case of the conventional power-on reset circuit.

Figure 4:
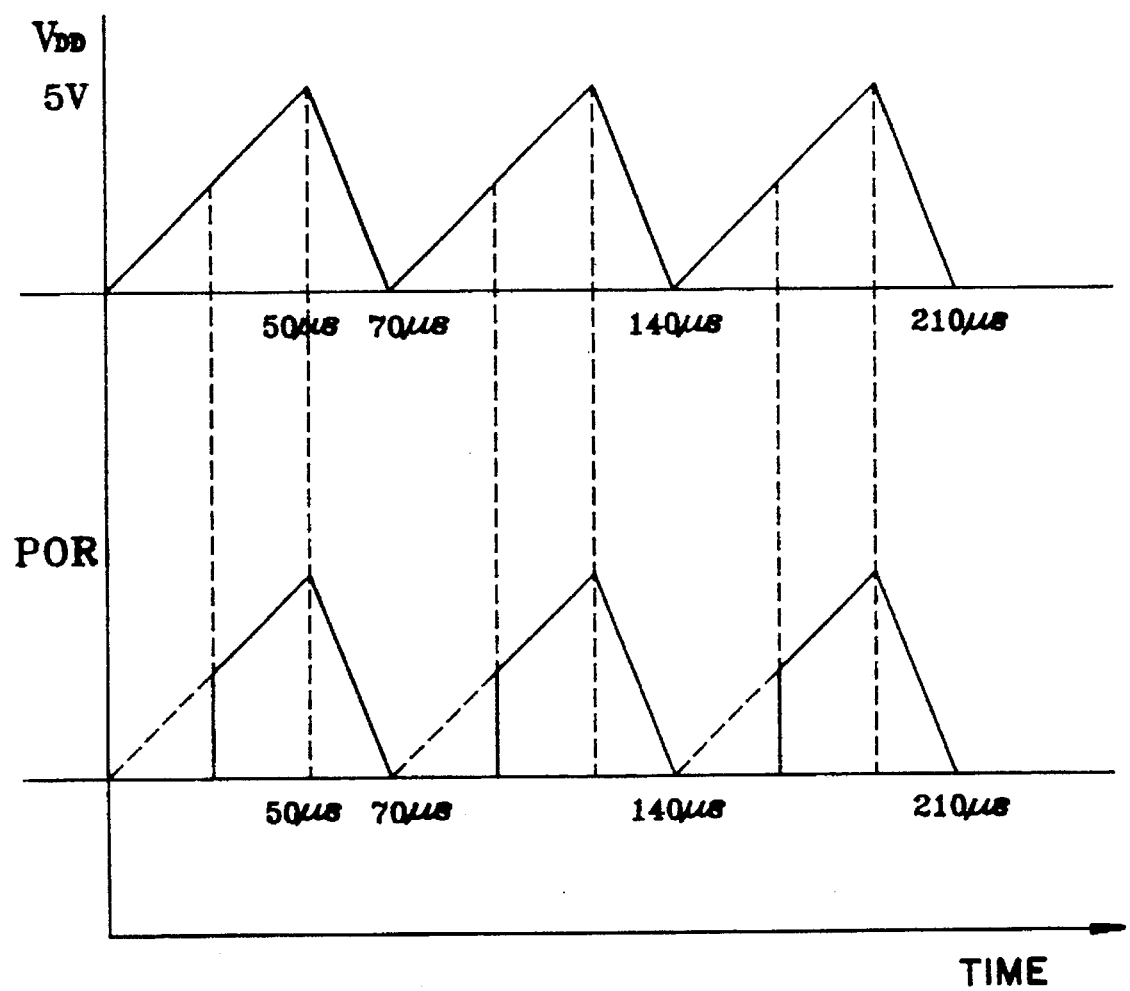
FIG. 4 is a waveform diagram of the power-on reset signal of the present invention, for the case when the power supply voltage is quickly switched on and off.

Referring to FIG. 4, the voltage at node A is discharged to ground potential $V_{SS}$ in a shorter time by transistor P2 so that a stable reset signal POR is generated for a succeeding power-on state.

What is claimed is:

1. A power-on reset circuit for a semiconductor integrated circuit, comprising:

discharging means for fully discharging a first intermediate signal when a first power supply voltage is low and generating a first constant voltage of a power-on reset signal when the first power supply voltage is high;

delaying means for receiving the first intermediate signal, maintaining the power-on reset signal at the constant voltage for a predetermined time after the first power supply voltage is raised above a first predetermined voltage, and generating a second intermediate signal;

first inverting means for receiving and inverting the second intermediate signal; and buffering means for receiving the output of the first inverting means and outputting the power-on reset signal at a second constant voltage after the first power supply voltage is raised above a second predetermined voltage, wherein said discharging means comprises first, second, third and fourth transistors each having a gate, first drain/source and second drain/source, wherein said power supply voltage is connected to the first drain/source of said first transistor and the gate and first drain/source of said third transistor, wherein the gate and second drain/source of said first transistor, the second drain/source of said third transistor, the first drain/source of said second transistor and the first drain/source of said fourth transistor are commonly connected, and wherein the gate of said second transistor is connected to a first applied voltage, the second drain/source of said second transistor and the gate and second drain/source of said fourth transistor are connected to ground potential.

2. A power-on reset circuit as claimed in claim 1, wherein said first, second and third transistors are P-type and said fourth transistor is N-type.

3. A power-on reset circuit as claimed in claim 1, wherein said first applied voltage applied to the gate of said second transistor is lower than ground potential.

4. A power-on reset circuit as claimed in claim 3, wherein a negative bulk voltage is applied as said first applied voltage.

5. A power-on reset circuit as claimed in claim 2, wherein said first predetermined voltage is the threshold voltage of the first, second, and third P-type transistor, and said second predetermined voltage is the trigger point voltage of said first inverter.

6. A power-on reset circuit as claimed in claim 2, wherein said buffering means comprises second and third inverters.

7. A power-on reset circuit as in claim 1, wherein the first inverting means comprises P-type and N-type CMOS transistors.

8. A power-on reset circuit as in claim 6, wherein the second and third inverting means each comprise P-type and N-type CMOS transistors.

9. A power-on reset circuit as in claim 1, wherein the discharging means comprises CMOS transistors.

10. A power-on reset circuit as in claim 1, wherein the buffering means comprises CMOS transistors.

11. A power-on reset circuit as in claim 1, wherein the discharging means, the delaying means, the first inverting means, and the buffering means comprise CMOS transistors.

* * * * *